United States Patent [19]

Feldman et al.

[11] Patent Number: 4,788,126

[45] Date of Patent: Nov. 29, 1988

[54] RADIATION DOSIMETER AND METHOD FOR MEASURING RADIATION DOSAGE

[75] Inventors: Lyudmila Feldman, Centerville; Paul C. Adair, Springboro; Todd M. Hess, Columbus, all of Ohio

[73] Assignee: The Mead Corporation, Dayton, Ohio

[21] Appl. No.: 52,638

[22] Filed: May 20, 1987

[51] Int. Cl.$^4$ .................... G03C 1/72; G01N 21/00
[52] U.S. Cl. .................. 430/138; 250/474.1; 250/482.1; 250/492.1
[58] Field of Search .......... 430/138; 250/482.1, 250/474.1, 492.1

[56] References Cited

U.S. PATENT DOCUMENTS

| | | | |
|---|---|---|---|
| 2,680,816 | 6/1954 | Stern | 250/83 |
| 2,747,103 | 5/1956 | Fairbank et al. | 250/482.1 |
| 3,051,837 | 8/1962 | Nitka | 250/83 |
| 3,184,313 | 5/1965 | Rees et al. | 250/482.1 |
| 3,290,499 | 12/1966 | Lestervale et al. | 250/474.1 |
| 4,006,023 | 2/1977 | McLaughlin et al. | 430/338 |
| 4,399,209 | 8/1983 | Sanders et al. | 430/138 |
| 4,440,846 | 4/1984 | Sanders et al. | 430/138 |
| 4,501,809 | 2/1985 | Hiraishi et al. | 430/138 |
| 4,554,235 | 11/1985 | Adair | 430/138 |

*Primary Examiner*—Mukund J. Shah
*Attorney, Agent, or Firm*—Smith & Schnacke

[57] ABSTRACT

A radiation dosimeter comprising a support having a layer of microcapsules on the surface thereof, said microcapsules containing an image-forming agent and radiation curable composition, said composition being essentially insensitive to visible light and ultraviolet radiation and being sensitive to gamma and electron beam radiation; and a process for measuring gamma and electron beam radiation.

12 Claims, No Drawings

RADIATION DOSIMETER AND METHOD FOR MEASURING RADIATION DOSAGE

Background of the Invention

The present invention relates to dosimeters which are sensitive to gamma and/or electron beam radiation and to products utilizing microencapsulated photocurable materials for detecting, indicating, recording, and measuring such radiation.

U.S. Pat. Nos. 4,399,209 and 4,440,846 describe photographic materials which employ a microencapsulated radiation curable composition containing a color precursor. These materials are used in an imaging process wherein they are image-wise exposed to actinic radiation and subjected to a uniform force which causes the microcapsules to rupture and release the color precursor. In fully exposed areas, the radiation curable composition is cured. The cured composition prevents the color precursor from being released from the internal phase of the microcapsule. In unexposed and partially-exposed areas, the color precursor is released in an amount which depends on the degree of exposure. In totally unexposed areas, the color precursor is released in large amounts. In partially exposed areas, the color precursor is released in intermediate amounts. In this manner, the color precursor is image-wise released from the microcapsules. The color precursor reacts with a developer present on the same or an adjacent substrate to produce an image.

Japanese Unexamined Published Application No.56-111722 discloses a similar photographic material and states that it may be used as a light sensor which is capable of indicating exposure by means of the shade of a color.

Gamma and electron beam radiation are now widely used in industry. For example, gamma radiation is used in the food industry as a means for killing bacteria and insects and preserving food. It is used in the pharmaceutical industry as a means for sterilizing pharmaceuticals and in the hospital supply industry as a means for sterilizing surgical gloves, surgical drapes and the like.

A need has been recognized by industry for a radiation dosimeter which can be used in large as well as small formats and which can be developed on site without the need for wet development agents. Presently, some commercially available dosimeters must be returned to a laboratory for chemical processing. This is not only inconvenient, but there are numerous occasions on which it would be desirable to have reliable results of the radiation measurement more quickly; for example, during installation of a radiation source and where the exposure source must be periodically adjusted. While dosimeters capable of on-site processing are described in U.S. Pat. Nos. 2,747,103 and 3,051,837 to the best of the applicants knowledge, they are not commercially available. Radiochromic films can be instantly read after exposure but suffer from humidity, temperature and sensitivity to ultraviolet radiation. See U.S. Pat. Nos. 3,710,109 and 4,006,023.

SUMMARY OF THE INVENTION

In accordance with the present invention the photographic materials described in U.S. Pat. Nos. 4,399,209 and 4,440,846 and modifications thereof are used to detect and measure gamma and/or electron beam radiation.

One manifestation of the present invention is a radiation dosimeter comprising a support having a layer of microcapsules on the surface thereof wherein the microcapsules contain an image-forming agent and a radiation curable composition. The composition is preferably designed such that it is insensitive to visible and ultraviolet radiation but is sensitive to gamma and/or electron beam radiation. Typically, the radiation curable composition consists essentially of an ethylenically unsaturated compound. Such a composition is insensitive to room light and sunlight and, as such, the dosimeter can be manufactured without light shielding means such as foil members conventionally employed with certain dosimeters employing silver halide films or ultraviolet sensitive dyes. The image-forming agents used in the present invention include not only color precursors but colored dyes and pigments.

In accordance with a preferred embodiment of the invention, the dosimeter is designed to prevent oxygen from diffusing rapidly into the radiation curable composition. Oxygen is an inhibitor of free radical polymerization and if it is permitted to diffuse readily into the radiation curable composition, it prevents measurement of radiation. Dosimeters designed to measure low radiation levels must incorporate the means to limit and preferably exclude oxygen from the radiation curable composition.

In accordance with another manifestation of the invention, the dosimeter is supplied with a reference or comparison scale with which the density, color or shade of the image produced in the dosimeter can be compared to determine the amount of radiation to which the dosimeter is exposed. In this regard, the present invention includes digital-type dosimeters in which radiation above a certain threshold amount causes a color or density change; digital type dosimeters in which there are a plurality of thresholds such that different color changes occur as each threshold is exceeded; and analog-type dosimeters from which the amount of radiation can be determined quantitatively from the density or shade of the color produced upon developing the dosimeter.

The invention also includes a process comprising the steps of exposing a radiation dosimeter as described above to gamma or electron beam radiation, subjecting the microcapsules to a uniform rupturing force such that the image-forming agent is released from the microcapsules to form an image, the color, shade or density of which is an indication of the amount of exposure, and comparing the color, shade or density of the image with a reference image to determine the amount of exposure. In this regard, it is noted that reference to determining the amount of exposure is intended to encompass both digital dosimeters in which the determination is simply that a threshold has been exceeded as well as analog dosimeters in which the determination yields the quantity of radiation.

DETAILED DESCRIPTION OF THE INVENTION

In accordance with one embodiment of the present invention, the photographic materials described in U.S. Pat. Nos. 4,399,209 and 4,440,846 are used in radiation dosimetry without substantial modification. In most instances, however, it will be desirable to modify the photographic materials described in the aforesaid patents for application in this field.

The aforesaid patents describe photographic materials which are sensitive to ultraviolet and visible light. While these materials can be used in radiation dosimetry, means must be provided to shield the compositions from ultraviolet or visible light prior to exposure and development. Accordingly, one modification which is particularly desirable is the use of radiation curable compositions which are essentially insensitive to visible light and preferably both visible light and ultraviolet radiation.

The radiation curable compositions described for use in the photographic materials of the aforesaid patents include a radiation crosslinkable or polymerizable compound and a photoinitiator. The radiation curable compound is typically an ethylenically unsaturated monomer such as trimethylolpropane triacrylate (TMPTA) or an ethylenically unsaturated oligomer. In accordance with the present invention it is desirable to use these compositions but to eliminate the photoinitiator or at least that component of the photoinitiator which absorbs ultraviolet or visible radiation for generating free radicals. Nuclear radiation such as gamma radiation and electron beam radiation are capable of initiating free radical polymerization of ethylenically unsaturated compounds without a radiation absorber. The radiation reacts directly with the unsaturated compounds to generate propagating radicals which continue the polymerization.

It is, however, desirable to include a component of photoinitiator systems known as an autoxidizer in the radiation curable composition. The autoxidizer reacts with any oxygen which may be present in the composition and which may inhibit polymerization. These compounds are believed to function as efficient oxidants for peroxy compounds formed upon polymerization in the presence of oxygen.

Examples of autoxidizers are 4-t-butyl-N,N-dimethylaniline, 2,4,N,N-tetramethylaniline, 2,6,N,N-tetramethylaniline, N,N,2,4,6-pentamethylaniline, 2,6-diethyl-N,N-dimethylaniline, 2,6-diisopropyl-N,N-dimethylaniline(DIDMA), and 4,N,N-trimethylaniline. For compositions prepared and contained in an oxygen free environment, an autoxidizer will not be necessary in the compositions.

Another important modification relates to oxygen inhibition of free radical polymerization. In many applications, dosimeters are relied upon to measure low levels (dose rates) of radiation. If oxygen is not limited or prevented from diffusing into the radiation curable composition, the dosimeter may not be capable of measuring very low dosage rates. Specifically, if the rate of oxygen diffusion overcomes the rate with which free radicals are generated by the radiation, the dosimeter is not functional.

The dosimeter must be designed with means to limit or prevent oxygen diffusion into the radiation sensitive composition. U.S. Pat. No. 4,440,846 describes a self-contained photographic material in which the microcapsules containing the radiation curable composition, the color precursor, and the developer material for the color precursor are on the same surface of a support. In accordance with one embodiment of the present invention, this structure is produced between a pair of oxygen impermeable films (which may possibly form an envelope). A typical example of an oxygen impermeable film is poly(ethylene terephthalate). Oxygen impermeable papers could also be used. In accordance with this embodiment, a layer of radiation curable microcapsules and a layer of developer material are laminated between a pair of oxygen impermeable films or a mixed layer of microcapsules and developer is laminated between a pair of oxygen impermeable films. Possibly, if the developer layer exhibits low oxygen permeability, the cover layer could be eliminated in the former design. These film units are exposed to radiation and subject to a rupturing force such as pressure. Pressure ruptures the unhardened microcapsules whereupon the color precursor exudes from the microcapsules and reacts with the developer producing a color change. If one of the oxygen impermeable films is transparent, the color change can be observed directly. If not, it will be necessary to delaminate the film unit or simply remove it from its oxygen impermeable envelope to read the dosimeter.

In accordance with another embodiment of the invention, a self-contained photographic material of the type described in U.S. Pat. No. 4,440,846, or an imaging sheet of the type described in U.S. Pat. No.4,399,209 optionally modified such that they are insensitive to visible and ultraviolet light is simply placed between a pair of glass plates during exposure. The plates exclude oxygen. Thereafter, the photographic material is removed from the glass plates and developed in an otherwise conventional manner to produce an image which indicates the quantity of exposure or indicates that a threshold has been exceeded.

Other means for protecting the radiation curable composition from oxygen will also be evident. Of course, a microcapsule formed from an oxygen impermeable wall of material would be most desirable. While a degree of oxygen impermeability can be achieved by making the microcapsules with sufficiently thick walls, these microcapsules become more difficult to rupture and have not been found to be entirely satisfactory. Nevertheless, it is anticipated that microcapsules having sufficient oxygen impermeability to measure dosage rates of 6.5 krads/minute can be formed from wall materials such as melamine formaldehyde.

In accordance with another embodiment of the invention, the transfer imaging material described in U.S. Pat. No. 4,399,209 is modified by coating the microcapsule layer and developer layer on separate oxygen impermeable supports. These supports need not be transparent. Indeed, if the microcapsules are sensitive to visible light, it may be desirable to form the supports from a light blocking material. The coated supports are placed or laminated together with their reactive surfaces in contact. This unit is exposed to radiation and subjected to a rupturing force, for example, by passing the unit between a pair of pressure rollers. To read the results, the supports may be separated. On the other hand if the radiation curable composition is insensitive to ambient light and the supports are transparent films, the dosimeter may be read directly through the transparent support without delamination.

As previously indicated, two types of dosimeter may be prepared in accordance with the present invention. One indicates that a threshold radiation level has been exceeded. The other provides a quantitative indication of the amount of radiation. These dosimeters are obtained by controlling the capsule size distribution and/or the nature of the radiation curable composition. Whether a dosimeter is useful as a digital type or analog type dosimeter will depend on the relationship between the change in image density versus dose over the dose range which the dosimeter is designed to measure. By modifying the radiation curable composition, as described later, a dosimeter can be designed to give a controlled change in density per unit of exposure for use in analog applications or a very rapid (less gradual) response for use in digital applications.

For a digital dosimeter providing a plurality of threshold indications, a mixture of capsules designed to harden upon reaching or exceeding each threshold will be used. For an analog dosimeter, in many cases it will be possible to correlate radiation dose to a density change which will be a function of the degree of exposure and hardening of the microcapsules. Alternatively, a sheet having microcapsules of varying radiation curable compositions may be used.

The active dosage range of the dosimeter can be controlled by modifying the radiation curable composition. A monomer having bonds that can easily be broken or whose electrons can easily be extracted, are suitable for low dose detection. On the other hand, monomers which require a greater amount of energy to initiate polymerization and/or crosslinking are suitable for higher dose processes. Thus, by varying the concentration of these monomers in the radiation curable composition, the active dosage range of the dosimeter can be controlled. Typical examples of monomers whose electrons are easily extracted and which are useful in low dose dosimeters are unsaturated halides where the halide group is either iodide or bromide such as ethylene bromide. Examples of monomers particularly desirable for use in higher dose dosimeters are olefins. A TMPTA based radiation curable composition has been found to be sensitive in a range of 5 to 10 krad in the absence of oxygen and up to 50 krad when dosed in the presence of oxygen. This range is typically used in food irradiation operations and some electron beam applications.

Another modification of the radiation curable composition to control the active dosage range is to include an appropriate radiation absorber in the radiation sensitive composition to either decrease dose sensitivity, i.e., raise the threshold, or extend the dose range. Examples of compounds which may be useful as radiation absorbers in this context are inorganic pigments such as $TiO_2$. Hydroquinone and quinoline have also been found useful in extending range by retarding polymerization.

The photographic materials described in U.S. Pat. Nos. 4,399,209 and 4,440,846 are characterized in that the image-forming agent is a color former. While these agents are useful in the present invention, other image-forming agents can also be used. In photosensitive systems, it is important that the image-forming agent not absorb the actinic radiation to which the photosensitive composition is designed to be sensitive. While this is also true in dosimetry, colored dyes and pigments generally do not absorb gamma and electron beam radiation to an extent that will impede polymerization and, consequently, they can be used as image-forming agents in the present invention. When using a colored dye or pigment, development must include transfer of the dye or pigment. Transfer may be made to a receiver sheet which may be plain paper or paper specially treated to facilitate or enhance dye or pigment transfer or adhesion or a clear film. The amount of dye or pigment transferred to the image receiving sheet as measured by the density of the transfer image indicates the amount of radiation.

The dosimeters which have been discussed to this point are dosimeters in which the radiation level is indicated by the density of the image formed. Those skilled in the art will appreciate that it is also possible to design dosimeters in which the amount of radiation is indicated by the color or shade of the image. For example, a dosimeter can be prepared in which the layer of microcapsules includes a mixture of two or more sets of microcapsules which harden upon exposure to different levels of radiation. Shade or color differences can also be achieved by blending mixtures of microcapsules containing different image-forming agents and different radiation curable compositions. If one composition is more sensitive than the other, a shade or color difference will result which is dependent on the amount of radiation. If the radiation sensitive layer of the dosimeter includes a uniform mixture of these two types of microcapsules, the image produced will vary in both density and color as a function of the amount of radiation received.

The dosimeters of the present invention are useful in a wide variety of applications including materials testing, radiation therapy (0–3,000 rad), industrial radiography (0.1–500 krad) medical sterilization and mapping (1.0–6.0 mrad) and PCB degradation, however, two applications in which they find particular use are food irradiation mapping and dose mapping in diagnostic applications.

The microencapsulation techniques described in U.S. Pat. Nos. 4,399,209 and 4,440,846 are useful in making the microcapsules used in the present invention. A particularly useful process using pectin in the preparation of urea-formaldehyde and melamine formaldehyde microcapsules is described in U.S. Pat. No. 4,608,330.

In order to determine the amount of radiation, the dosimeter will typically be accompanied by a comparison or reference strip. If the dosimeter is a threshold type unit, this strip may not be necessary. Radiation exceeding the threshold limit will typically be indicated by disappearance of a reference color.

In quantitative or analog dosimeters, some form of reference will be necessary. This reference may be separate from or integral with the dosimeter. Of course, the reference strip can consist of a pre-printed form displaying the density and/or color shade scale and the corresponding dosage level. Alternatively, the reference strip can be formed integral with the dosimeter. This can be accomplished by, for example, including markings along one border of the dosimeter indicating quantitative dosage levels and exposing the dosimeter in the border region in amounts corresponding to the markings. This portion of the dosimeter may be subjected to the rupturing force as part of the manufacturing process. Alternatively, for dosimeters designed to measure low levels of radiation, if the border of the dosimeter is open to oxygen, oxygen may function to "fix" the image at the border such that the reference strip can be developed without further exposure automatically upon developing the dosimeter.

The present invention is illustrated in more detail by the following non-limiting examples:

EXAMPLE

Radiation sensitive microcapsules were prepared as follows:.

A mixture of 10.51 g polystyrene sulfonate (Versa TL-500 a product of National Starch and Chemical Co.) and 369.50 g distilled water were mixed and stirred 17 minutes at 35° C. and 500 rpm. To the stirred mixture were added 11.99 g pectin and 0.25 g $NaHCO_3$ to prepare a continuous phase. The continuous phase was stirred 2 hours and 48 minutes at 80° C. and 2,000 rpm. To the aqueous phase were added 9.01 g Crystal Violet Lactone which was stirred 8 minutes at 2,000 rpm. The Ph was adjusted to 6.0 by the addition of 10% $H_2SO_4$. To the aqueous phase was then added 150.38 g TMPTA, 3.01 g DIDMA, and 10.32 g of a biuret of hexamethylene diiosocyanate designated N-100 available from MOBAY Chemical Corp. The mixture was stirred 20 minutes at 80° C. and 3,000 rpm. Separately, 267.74 g 8.3% melamine solution and 37.10 g 37% formaldehyde solution were mixed. The Ph was adjusted to 8.5 with 10% $NaHCO_3$. The mixture was stirred and heated to 60° C. After the solution cleared, stirring was continued for approximately 40 minutes at 60° C. The solution was cooled 15 minutes and then added to the preparation described above.

After adding the melamine-formaldehyde preparation, emulsification was continued for 2 hours and 6 minutes at 66° C. and 3,000 rpm. During this time the Ph was maintained at 6.0 by the addition of 10% $H_2SO_4$. Thereafter, 46.20 g 50% urea solution was added with continued stirring for 46 minutes at 3,000 rpm. The Ph was adjusted to 9.5 by the addition of 20% NaOH. Stirring was continued overnight at 500 rpm.

A coating composition comprising 95% of the capsule emulsion prepared as above, 4% polyvinyl alcohol, 1% Triton X-100 (a product of Rohm and Haas Chemical Co.) at 20% solids was prepared. The coating was drawn down on a 3 mil film of poly(ethylene terephthalate) to provide a coat weight of 8 g/m². Capsule analysis showed that the capsules range from 2 to 40 microns in size with the average particle size being 8.8 microns. Ninty-five percent of the microcapsules were less than 15 microns.

The dosimeter prepared as above was exposed to gamma radiation. Upon development against a standard developer sheet, unexposed regions provided a color density of 1.35. Regions exposed to 100 krad provided a density of 0.47. Regions exposed to 3.0 Mrad provided a color density of 0.25.

Having described the invention in detail and by reference to preferred embodiments thereof, it will be apparent that modifications and variations are possible without departing from the scope of the invention defined in the appended claims.

What is claimed is:

1. A radiation dosimeter comprising a support having a layer of microcapsules on the surface thereof, said microcapsules containing an image-forming agent and a radiation curable composition, said composition being essentially insensitive to visible light and ultraviolet radiation and being sensitive to gamma electron beam radiation such that when exposed to gamma or electron beam radiation, said composition polymerizes and hardens said microcapsules.

2. The dosimeter of claim 1 wherein said radiation curable composition consists essentially of an ethylenically unsaturated compound and an autoxidizer.

3. The dosimeter of claim 1 wherein said radiation curable composition consists essentially of an ethylenically unsaturated compound.

4. The dosimeter of claim 1 wherein said dosimeter includes means for shielding said radiation sensitive composition from oxygen.

5. A process for detecting and/or measuring gamma or electron beam radiation which comprises:
   exposing a dosimeter including a support having a layer of microcapsules on the surface thereof to gamma or electron beam radiation, said microcapsules containing and image-forming agent and a radiation curable composition, said composition being essentially insensitive to visible light and ultraviolet radiation and being sensitive to gamma or electron beam radiation such that, upon exposure to gamma or electron beam radiation, said composition polymerizes and composition polymerizes and hardens said microcapsules;
   subjecting said layer of microcapsules to a uniform rupturing force such that said image-forming agent is released from said microcapsules to form and image, the color, shade or density of said image corresponding to the amount of radiation to which said dosimeter is exposed; and
   comparing the color, shade or density of said image with a reference image to determine the amount of exposure.

6. The process of claim 5 wherein said image-forming agent is a color precursor and said step of subjecting said dosimeter to a uniform rupturing force is carried out in the presence of a developer material with which said color precursor reacts to form said image.

7. The process of claim 5 wherein said dosimeter includes means for shielding said radiation sensitive composition from visible or ultraviolet light.

8. The process of claim 5 wherein said dosimeter includes means for shielding said radiation sensitive composition from oxygen.

9. The process of claim 5 wherein said dosimeter is sensitive to radiation in a range of 0.1 to 6000 krad.

10. The dosimeter of claim 1 wherein said image-forming agent is a visible dye or pigment.

11. The dosimeter according to claim 1 wherein said dosimeter is an analog dosimeter capable of providing a quantitative indication of the amount of radiation for a given exposure.

12. The dosimeter according to claim 1 wherein said dosimeter is a digital dosimeter capable of indicating that a given radiation level has been exceeded.

* * * * *